(12) United States Patent
Moore et al.

(10) Patent No.: US 7,997,851 B2
(45) Date of Patent: Aug. 16, 2011

(54) APPARATUS AND METHOD FOR A MULTI-LEVEL LOAD LOCK CHAMBER, TRANSFER CHAMBER, AND ROBOT SUITABLE FOR INTERFACING WITH SAME

(75) Inventors: Robert B. Moore, Lewistown, MT (US); Eric Ruhland, Pleasanton, CA (US); Satish Sundar, Milpitas, CA (US); Mario David Silvetti, Morgan Hill, CA (US)

(73) Assignee: Applied Materials, Inc., Santa Clara, CA (US)

( * ) Notice: Subject to any disclaimer, the term of this patent is extended or adjusted under 35 U.S.C. 154(b) by 238 days.

(21) Appl. No.: 12/257,262

(22) Filed: Oct. 23, 2008

(65) Prior Publication Data

US 2009/0092466 A1    Apr. 9, 2009

Related U.S. Application Data

(62) Division of application No. 11/424,461, filed on Jun. 15, 2006, now Pat. No. 7,695,232.

(51) Int. Cl.
    *B21D 39/03* (2006.01)
(52) U.S. Cl. .................................. 414/805; 29/428
(58) Field of Classification Search .................. 414/217, 414/806; 29/428, 592.1
    See application file for complete search history.

(56) References Cited

U.S. PATENT DOCUMENTS

| | | | |
|---|---|---|---|
| 6,062,798 A * | 5/2000 | Muka | 414/416.03 |
| 6,074,443 A | 6/2000 | Venkatesh et al. | |
| 6,082,950 A * | 7/2000 | Altwood et al. | 414/217 |
| 6,143,083 A * | 11/2000 | Yonemitsu et al. | 118/719 |
| 6,152,070 A * | 11/2000 | Fairbairn et al. | 118/719 |
| 6,270,582 B1 | 8/2001 | Rivkin et al. | |
| 6,315,512 B1 * | 11/2001 | Tabrizi et al. | 414/217 |
| 6,340,405 B2 | 1/2002 | Park | |
| 6,486,444 B1 * | 11/2002 | Fairbairn et al. | 219/390 |
| 6,506,994 B2 | 1/2003 | Wang et al. | |
| 6,647,665 B1 * | 11/2003 | Tabrizi et al. | 49/340 |
| 6,696,367 B1 | 2/2004 | Aggarwal et al. | |
| 6,729,824 B2 * | 5/2004 | Lei et al. | 414/217 |
| 6,949,143 B1 * | 9/2005 | Kurita et al. | 118/719 |
| 6,962,644 B2 * | 11/2005 | Paterson et al. | 156/345.28 |

(Continued)

FOREIGN PATENT DOCUMENTS

| | | |
|---|---|---|
| JP | 2001-044258 | 2/2001 |
| KR | 2001-0002112 | 1/2001 |

OTHER PUBLICATIONS

Notice on the Second Office Action for Chinese Patent Application No. 200780015187.0 dated Apr. 21, 2010.

(Continued)

*Primary Examiner* — Charles A Fox
(74) *Attorney, Agent, or Firm* — Patterson & Sheridan, L.L.P.

(57) ABSTRACT

A new apparatus for processing substrates is disclosed. A multi-level load lock chamber having four environmentally isolated chambers interfaces with a transfer chamber that has a robotic assembly. The robotic assembly has two arms that each can move horizontally as the robotic assembly rotates about its axis. The arms can reach into the isolated chambers of the load lock to receive substrates from the bottom isolated chambers, transport the substrates to process chambers, and then place the substrates in the upper chambers. The isolated chambers in the load lock chamber may have a pivotably attached lid that may be opened to access the inside of the isolated chambers.

4 Claims, 10 Drawing Sheets

U.S. PATENT DOCUMENTS

| | | | |
|---|---|---|---|
| 7,105,463 B2 * | 9/2006 | Kurita et al. | 438/782 |
| 2002/0195201 A1 | 12/2002 | Beer et al. | |
| 2003/0075915 A1 * | 4/2003 | Kim | 280/838 |
| 2003/0198376 A1 | 10/2003 | Sadighi et al. | |
| 2003/0213560 A1 | 11/2003 | Wang et al. | |
| 2004/0123953 A1 | 7/2004 | Beer et al. | |
| 2004/0137741 A1 | 7/2004 | Chebi et al. | |
| 2005/0098115 A1 | 5/2005 | Barnes et al. | |
| 2005/0150452 A1 | 7/2005 | Sen et al. | |
| 2005/0196971 A1 | 9/2005 | Sen et al. | |
| 2005/0229849 A1 | 10/2005 | Silvetti et al. | |
| 2006/0014397 A1 | 1/2006 | Seamons et al. | |
| 2006/0182615 A1 | 8/2006 | Kurita et al. | |
| 2006/0245852 A1 * | 11/2006 | Iwabuchi | 414/217 |

OTHER PUBLICATIONS

Korean Office Action dated Oct. 21, 2010 for Korean Application No. 10-2008-7026104.

PCT International Preliminary Report on Patentability dated Dec. 31, 2008 for International Application No. PCT/US2007/070328.

* cited by examiner

APPARATUS AND METHOD FOR A MULTI-LEVEL LOAD LOCK CHAMBER, TRANSFER CHAMBER, AND ROBOT SUITABLE FOR INTERFACING WITH SAME

CROSS-REFERENCE TO RELATED APPLICATIONS

This application is a divisional of the U.S. patent application Ser. No. 11/424,461, filed Jun. 15, 2006, now U.S. Pat. No. 7,695,232, which issued on Apr. 13, 2010, entitled "MULTI-LEVEL LOAD LOCK CHAMBER, TRANSFER CHAMBER, AND ROBOT SUITABLE FOR INTERFACING WITH SAME", which is herein incorporated by reference.

BACKGROUND OF THE INVENTION

1. Field of the Invention

Embodiments of the present invention generally relate to an apparatus for performing multiple processes on a substrate in succession within an environmentally controlled atmosphere.

2. Description of the Related Art

Substrate throughput in semiconductor processing is always a challenge. If technology is to advance, semiconductor substrates continually need to be processed efficiently. Cluster tools have developed as an effective means for processing multiple substrates simultaneously without breaking vacuum. Instead of processing a single substrate and then exposing the substrate to atmosphere during transfer to another chamber, multiple process chambers can be connected to a common transfer chamber so that when a process is complete on the substrate in one process chamber, the substrate can be moved, while still under vacuum, to another process chamber that is coupled to the same transfer chamber.

Another benefit of cluster tools is that multiple substrates can be processed within the tool in different chambers at the same time. After one substrate has exited a process chamber and transferred into another process chamber, a second substrate can be placed into the first process chamber. Thus, sequential processes can be performed on different substrate simultaneously within the cluster tool.

To enter the transfer chamber, a substrate first passes through a load lock chamber. The load lock chamber may heat the substrate prior to processing. After all of the substrate processing to be performed within the cluster tool has completed on the substrate, the substrate is transferred back to the load lock where it can exit the cluster tool system.

Therefore, a cluster tool can be very useful in increasing substrate throughput. Of course, there is always a desire to increase substrate throughput even more. Thus, there is a need in the art to increase substrate throughput in an apparatus that performs multiple processes on a substrate in succession.

SUMMARY OF THE INVENTION

The present invention generally comprises a multi-level load lock chamber, a transfer chamber, and a robot suitable for interfacing with the same. The multi-level load lock chamber has four environmentally isolated chambers and may be interfaced with a transfer chamber housing a robotic assembly. The robotic assembly has two arms that can independently move both horizontally and vertically as the robotic assembly rotates about its axis. The robot is configured to access both upper and lower chambers of the load lock with each of its arms.

In one embodiment, a load lock chamber is disclosed. The load lock chamber includes a unitary chamber body having first, second, third and fourth environmentally isolated chambers formed therein. The first and second chambers are in a laterally spaced relation. The third and fourth chambers are in a laterally spaced relation and at an elevation below the first and second chambers. Each of the environmentally isolated chambers has a substrate support located therein.

In another embodiment, a transfer chamber is disclosed. The transfer chamber comprises a body having a load lock chamber interface and a central cavity. A robotic assembly is disposed in the cavity. A plurality of slit valve doors are coupled to the transfer chamber body within opening formed in the load lock chamber interface.

In another embodiment, a robotic assembly is disclosed that comprises two arms. The arms are movable both horizontally and vertically. Each arm comprises two substrate receiving extensions. Each substrate receiving extension is capable of receiving one substrate.

In another embodiment, an apparatus is disclosed that comprises a load lock chamber, a transfer chamber, and a robotic assembly disposed within the transfer chamber. The load lock chamber includes a unitary chamber body having first, second, third and fourth environmentally isolated chambers formed therein. The first and second chambers are in a laterally spaced relation. The third and fourth chambers are in a laterally spaced relation and at an elevation below the first and second chambers. Each of the environmentally isolated chambers has a substrate support located therein.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally comprises a processing apparatus having a multi-level load lock chamber and a transfer chamber. The multi-level load lock chamber has four environmentally isolated chambers and interfaces with a transfer chamber that has a robotic assembly. In some embodiments, the robotic assembly includes two arms that each can move both horizontally as the robotic assembly rotates about its axis. The arms can reach into the bottom, isolated chambers of the load lock chamber to receive substrates, transport the substrate to process chambers, and then place the substrates in the upper, isolated chambers. Each of the isolated chambers in the load lock chamber includes a lid that can be opened to access the inside of the isolated chambers. Embodiments of the present invention can be utilized as a transfer chamber, load lock chamber, and/or transfer robot in a cluster tool such as the PRODUCER® SE processing system produced by Applied Materials, Inc., Santa Clara, Calif. It is also contemplated that the invention may be beneficially embodied in other chambers, robots, and cluster tools, including those available from other manufacturers.

Figure 1:
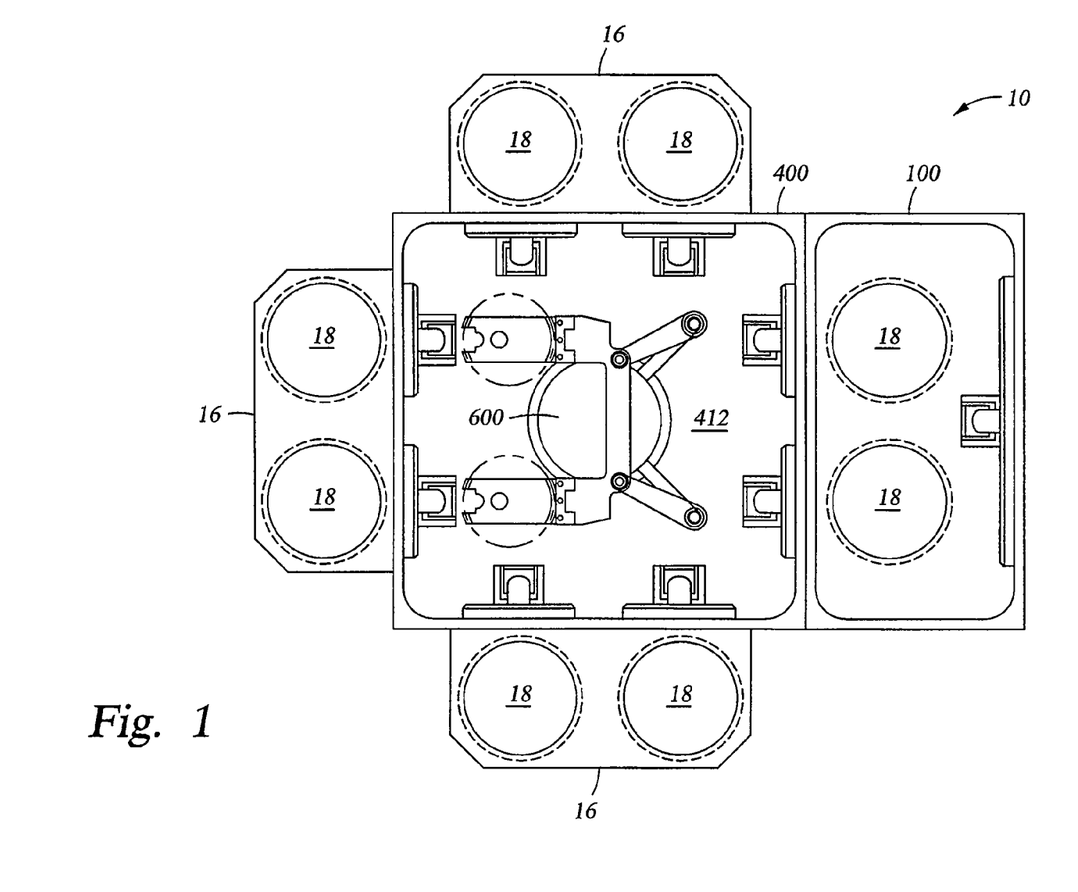
FIG. 1 is a plan view of an apparatus comprising a load lock chamber, transfer chamber with robotic assembly disposed therein, and processing chambers.

FIG. 1 shows a plan view of one embodiment of a cluster tool or processing system 10 that comprises a multi-level load lock chamber 100, a transfer chamber 400 coupled to the load lock chamber 100, and a plurality of process chambers 16. A transfer chamber robot 600 is located within a central cavity 412 of the transfer chamber 400. The load lock chamber 100 has a factory interface side where substrates 18 will be brought into the load lock chamber 100 to begin processing and a transfer chamber side in which substrates 18 will enter into from the load lock chamber 100 after processing. The transfer chamber robot 600 is suitable for transferring substrates between the processing chambers 16 and the load lock chamber 100.

Load Lock Chamber

Figure 2:
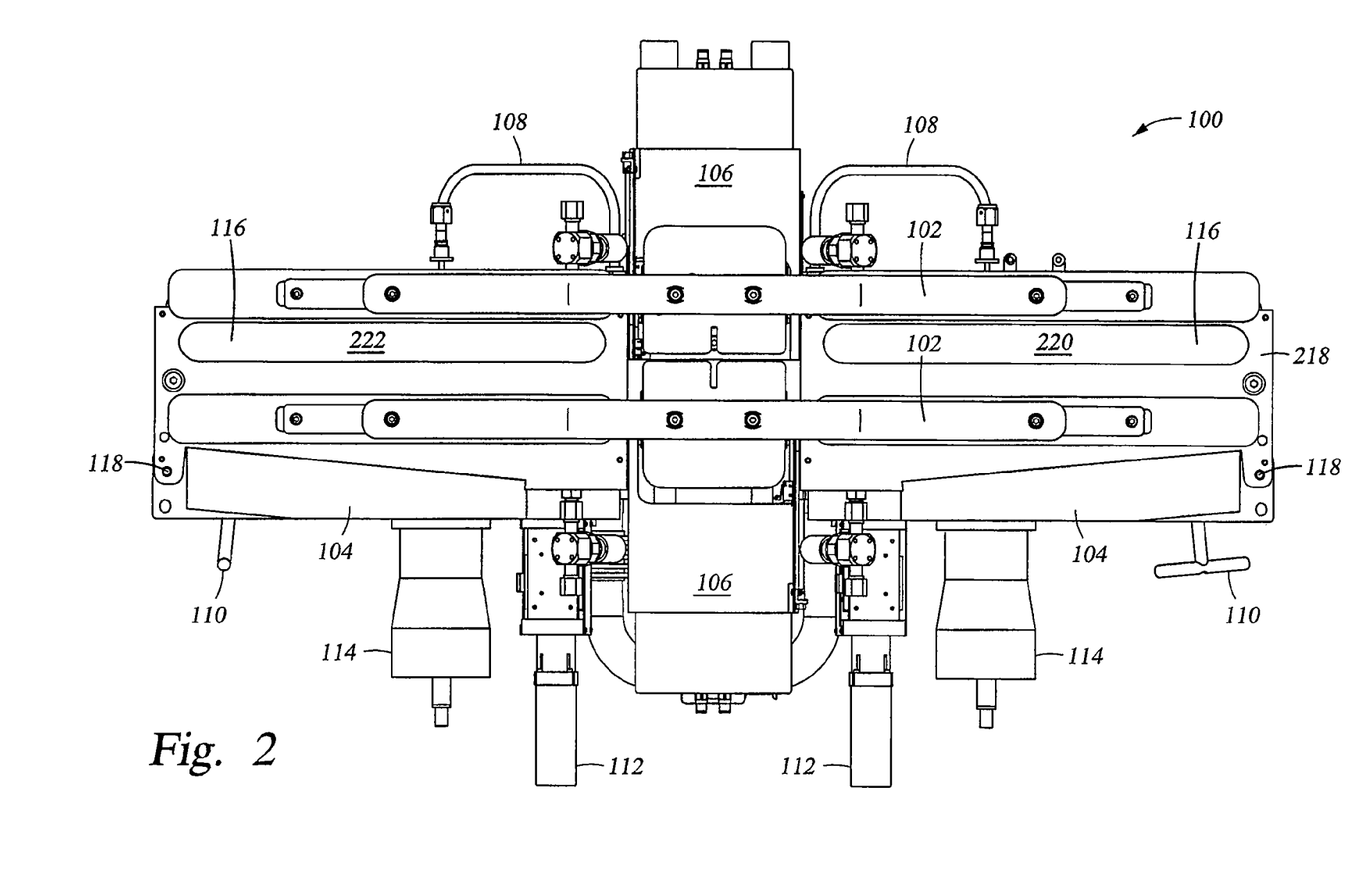
FIG. 2 is a front view of a factory interface side of a load lock chamber of the present invention.
Figure 3:
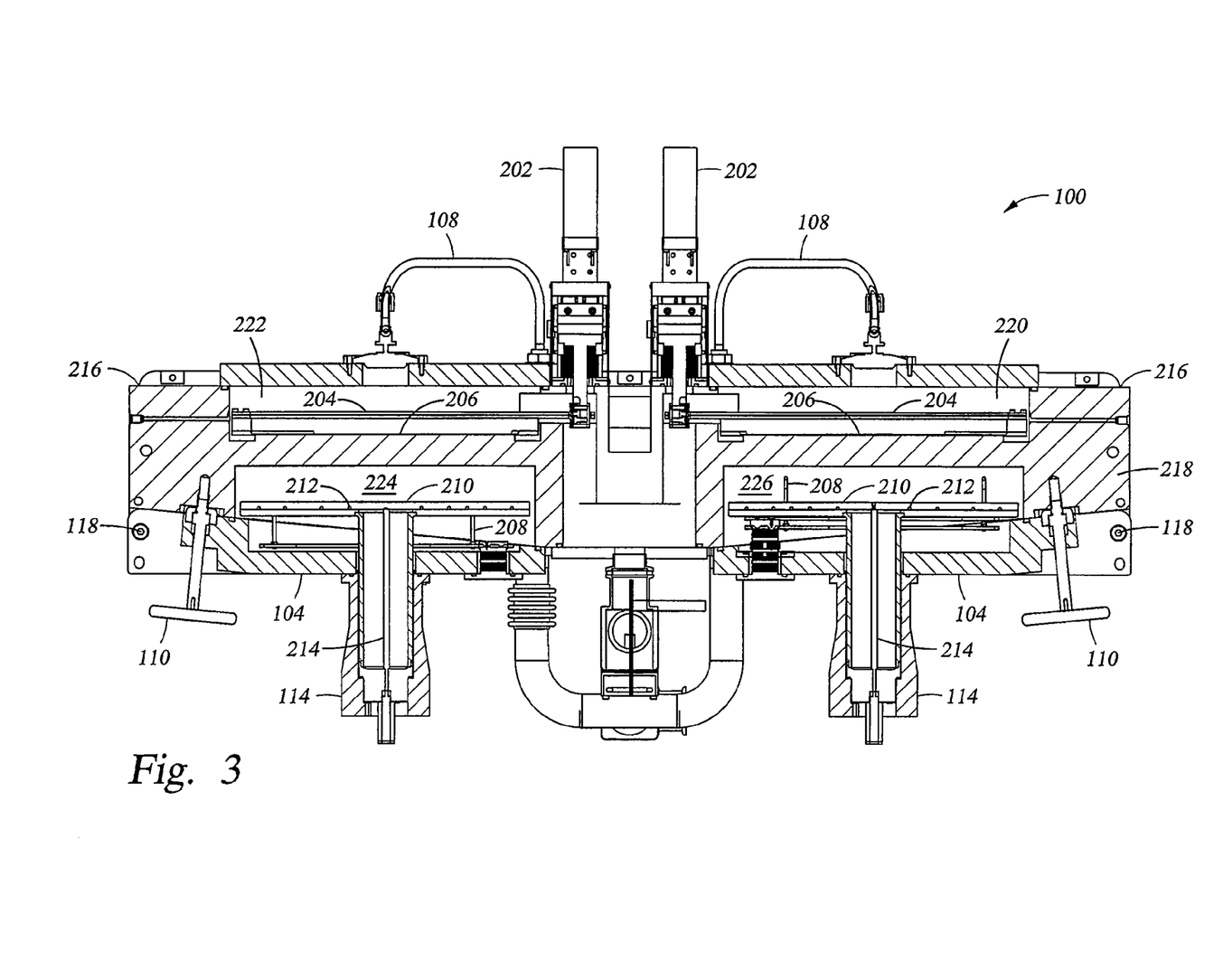
FIG. 3 is a cross sectional view of a load lock chamber of the present invention.
Figure 4:
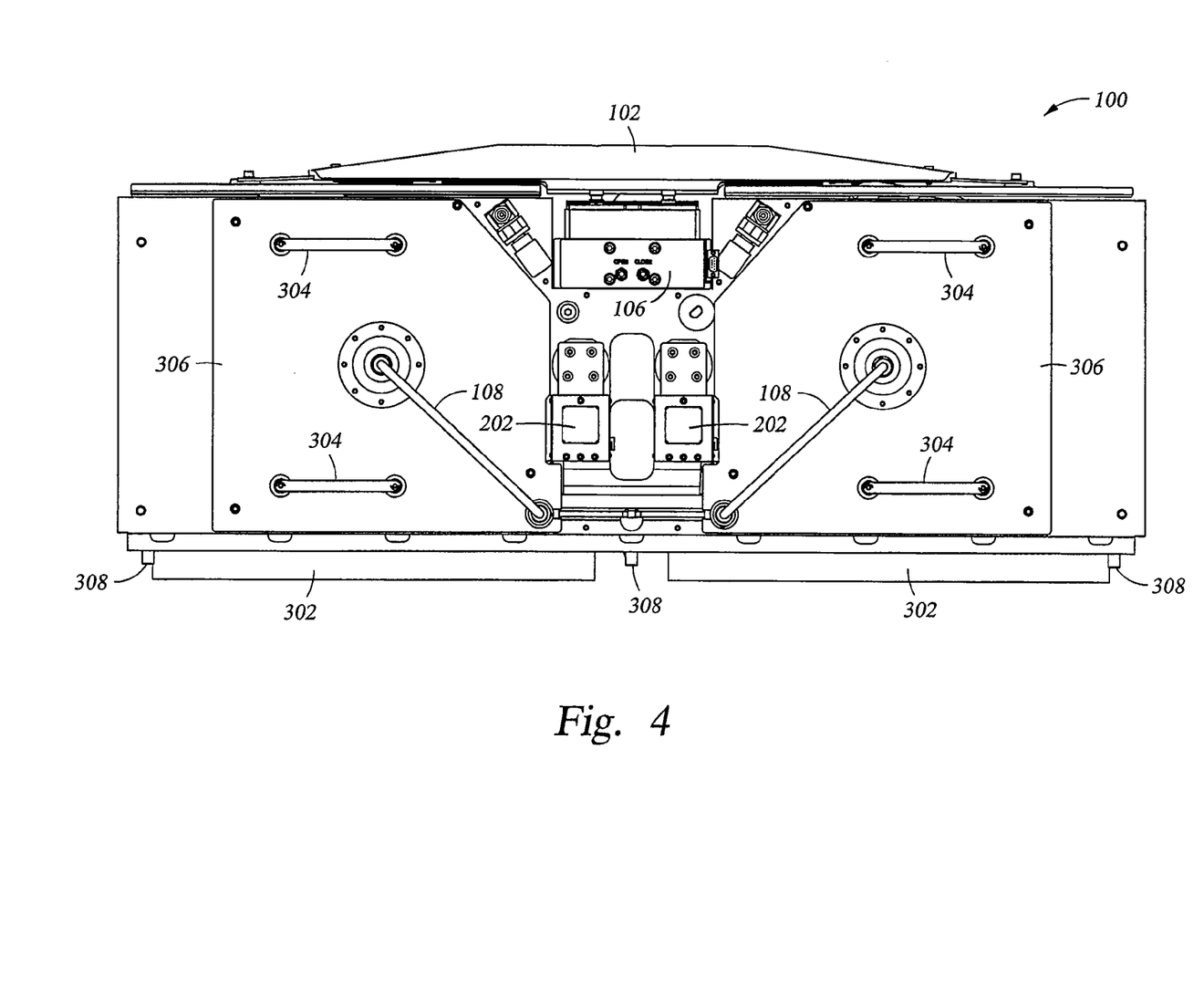
FIG. 4 is a top view of the load lock chamber of the present invention.

FIGS. 2-4 show various views of a load lock chamber according to one embodiment of the present invention. FIG. 2 is a front view of a factory interface side of one embodiment of a multi-level load lock chamber 100 according to the present invention. FIG. 3 is a cross sectional view of a load lock chamber. FIG. 4 is a top view of the load lock chamber. Referring to FIG. 2, the load lock chamber 100 includes slit valve doors 102, chamber access lids 104, slit valve door actuators 106, fluid feed tubes 108, lid locking mechanisms 110, substrate lift pin actuators 112, substrate support columns 114, and chamber openings 116. The multi-level load lock chamber 100 allows for continuous transfer of substrates into and out of the system. The fluid feed tubes 108 may supply nitrogen.

The load lock chamber 100 has a unitary chamber body 218. A first chamber 220 and a second chamber 222 formed in the chamber body 218 in a laterally spaced relation. A third chamber 224 (see FIG. 3) and a fourth chamber 226 (see FIG. 3) are formed in the chamber body 218 in a laterally spaced relation at an elevation below the first 220 and second 222 chambers. The first 220, second 222, third 224 and fourth 226 chambers are environmentally isolated from each other to prevent any cross contamination. A substrate support 206, 210 (see FIG. 3) is located in each chamber. The two upper chambers 220, 222 are shown within the openings 116 and the two lower chambers 224, 226 are behind the lower slit valve door 102. The upper chambers 220, 222 can operate independently of the lower chambers 224, 226 so that the upper chambers 220, 226 are not affected by any activity involving the lower chambers 224, 226. Additionally, each individual chamber can operate independently (i.e., open/close, vented and evacuate) of the other chambers within the load lock chamber 100 so that each chamber will not be affected by any activity in any other chamber with the load lock chamber 100. Having four environmentally isolated chambers within the load lock chamber 100 reduces the internal volume within each of the chambers, which allows for reduced the evacuation time and correspondingly requires smaller and less expensive vacuum pumps.

Continuous in and out movement of substrates may occur because each chamber 220, 222, 224, 226 has a dictated chamber volume that is environmentally isolated from the other chambers. Outgassing from inbound substrates will not come into contact with outbound substrates. The environmentally isolated chamber volumes may independently maximize the substrate throughput of inbound and outbound substrates. Additionally, any contamination or cross talk from outbound wafers is isolated from the inbound wafers because of the inbound chambers are isolated from the outbound chambers.

In one embodiment, the bottom two chambers 224, 226 are used for incoming (i.e., unprocessed) substrates and the upper chambers 220, 222 are used for outgoing substrates that have been processed within the system. The substrates may be brought into the lower chambers 224, 226 two at a time. In other words, a respective single substrate will be placed into each lower chamber 224, 226 substantially simultaneously. The substrates will then be transferred out of the load lock chamber 100 and into processing system, where the substrates will be processed. After all processing has been completed, the substrates will be removed from the system by passing them through the upper chambers 220, 222 of the load lock chamber 100. It is contemplated that the processed and unprocessed substrates may be moved through other combinations of chambers within the chamber body 218.

Slit valve doors 102 extend horizontally across the load lock chamber 100 on the factory interface side and each cover two horizontal chamber openings 116 formed through the chamber body 218. A single slit valve door 102 is used to seal two upper chambers 220, 222 and a single slit valve door 102 is used to seal two lower chambers 224, 226. Actuators 106 open the slit valve doors 102 to expose the interior of chambers through the chamber openings 116. The actuator 106 located on the top of the multi-level load lock chamber 100 to operate the door 102 that selectively seals the first 220 and second 222 chambers. The second actuator 106 located on the bottom of the multi-level load lock chamber 100 to operate the door 102 that selectively seals the third 224 and fourth 226 chambers. The actuators 106 operate such that the slit valve doors 102 open in opposite directions. The slit valve actuators 106 operate independently of each other so that the lower actuator 106 may open or close the lower slit valve door 102 independently of the upper actuator 106. The slit valve door 102 for the upper chambers 220, 222 opens upward and the slit valve door for the lower chambers 224, 226 opens downward.

A benefit of the upper chambers 220, 222 sharing a single slit valve door 102 on the factory interface side rather than one upper chamber and one lower chamber sharing a slit valve door 102 is that the upper chambers 220, 222 can operate in unison which increases the efficiency of substrate throughput. Similarly, the lower chambers 224, 226 can operate in unison to further enhance substrate throughput. The transfer robot (discussed below) is designed to simultaneously access two chambers having substrate supports disposed at a substantially similar elevation, such as lying within the same plane. If one upper chamber and one lower chamber were to perform substantially similar functions substantially simultaneously (i.e., operate in unison), then transferring substrates to processing chambers lying in substantially the same plane would be much more difficult and less efficient.

The upper chambers 220, 222 within the load lock chamber 100 can be actively cooled by a heat exchange fluid that travels through the load lock chamber and pulls the heat from the substrate in the upper chambers 220, 222 as the chambers are vented to atmosphere. The substrate can additionally or alternatively be cooled on a cooling plate. The cooling plate includes a plurality of standoff pins that maintain the substrate and the substrate support in a space-apart relation to reduce potential backside contamination and provide a uniform gap between the substrate and substrate support to promote uniform radiant cooling. In one embodiment, the gap may be about 0.05 inches to about 0.025 inches. In another embodiment, the gap may be about 0.010 inches to about 0.020 inches. In yet another embodiment, the gap may be 0.015 inches. The gap allows the substrate to be spaced from the cooling plate to reduce potential backside contamination, while also efficiently cooling the substrate.

Each chamber within the load lock chamber 100 has an independently operated substrate support 206, 210 with corresponding lift. The lift in the lower chambers 224, 226 is a series of lift pins 208. The lift in the upper chambers is a hoop 204 with standoff pins. Each chamber within the chamber body 218 has a volume that is environmentally isolated from the other chambers of the load lock chamber 100 and the processing environment. The lids 306 (see FIG. 4), 104 (see FIG. 2) for the upper 220, 222 and lower 224, 226 chambers may be transmissive or have a region that is transmissive to a metrology signal so that metrology can be performed during processing. A lid 104, 306 that is transmissive allows sensors to monitor different conditions and parameters of the substrate and any layers deposited thereon. In one embodiment, the lids 104, 306 are transmissive. In another embodiment, the lids 304, 306 are transmissive quartz.

Figure 10:
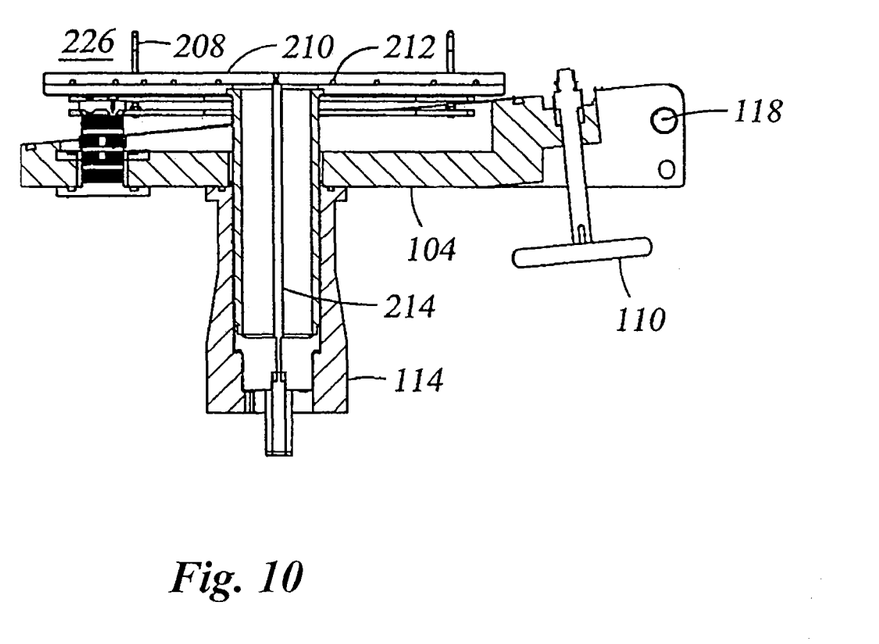
FIG. 10 is a cross-sectional view of a lid and components attached thereto.

The load lock chamber 100 can be easily serviced by opening the lids 306, 104 that are present for each of the upper chambers 220, 222 and the lower 224, 226 chambers. The lids 104 for the lower chambers 224, 226 are pivotably attached to the load lock chamber 100. FIG. 10 is a cross-sectional view of the lid 104 and components coupled thereto. The pivotably attached lids 104 for the lower chambers 224, 226 allow a technician to service the lower chambers 224, 226 with minimal removal of hardware. The lids 104 are cut on an angle (see FIG. 2) to allow the support columns 114 to swing clear of the chamber body 218. When the lids 104 are swung out 180 degrees, a technician may service all of the components of the lower chambers 224, 226 easily and efficiently. The lids 104 for the lower chambers 224, 226 are locked closed to the load lock chamber 100 by lid locking mechanisms 110 that attach to the load lock chamber 100. In one embodiment, the lid locking mechanisms 110 threadedly attach to the load lock chamber 100 and may be tightened to clamp the lid 104 to the chamber body 218. The lids 104 for the lower chambers pivot about hinge 118 (see FIG. 2). FIG. 4 shows the upper lids 306, which are attached at point 216 (see FIG. 2), wherein the lids 306 have handles 304 that allow a technician to easily grasp an upper lid 306 and remove it. The lids 306 have a planar surface. The fluid feed tubes 108 index the lids 306 to the chamber. A fastener throughhole for sealing the lid 306 to the chamber 100 rotates around the fluid feed tube 108. Point 216 may be used as a fulcrum to control the weight of the lid 306 when closing the lid 306 to the chamber 100.

The load lock chamber 100 may interface with the transfer chamber 400 (see FIG. 5) by inserting male connectors 302, 308 of the load lock chamber 100 into female connectors 406, 408 (see FIG. 5) of the transfer chamber. The load lock chamber body 218 includes male connectors 302 that surround the openings of the upper 220, 222 and lower 224, 226 chambers of the load lock chamber 100. Round male connectors 308 extend from the chamber body 218 and insert into the transfer chamber 400 to locate the load lock chamber 100 relative to the transfer chamber 400. A seal (not shown) is disposed between the load lock chamber 100 and the transfer chamber 400 to prevent vacuum leakage.

In one mode of operation, a robot extends into the lower chambers 224, 226 to place substrates on a respective substrate support 210. Substrate support columns 114 are present in which heating fluid may flow to the lower chambers 224, 226. The lift pin actuator 112 will raise lift pins 208 (see FIG. 3) and lift the substrate off of the substrate support 210 when the substrate is ready to be transferred out of the load lock chamber 100 and into the transfer chamber 400. The pressure in the lower chambers then reduces to match that in the transfer chamber 400. During this time, the substrates may undergo a pre-processing process, such as pre-heating or cooling. Whether the substrates undergo a pre-processing process depends on the requirements of the primary process that the system performs on the substrates. For example, in certain applications, the primary process will proceed more quickly or more efficiently if the substrates are heated before the process begins.

The substrate can be heated by the heating elements 212 (see FIG. 3) that are present within the substrate support 210. Heating supply 214 (see FIG. 3) can supply the appropriate heating means such as a heated fluid to heating channels or electrical conduits that supply electricity to the heating elements 212. The heating supply is fed through the substrate support columns 114. In one embodiment, the load lock chamber 100 heats substrates in the lower chambers 224, 226 and cools substrates in the upper chambers 220, 222.

After the pressure in the lower chambers 224, 226 is reduced and the optional pre-processing is completed, the slit valve doors 502 (see FIG. 6) on the transfer chamber side open. Then the transfer chamber robot 600 (see FIG. 7) can service the lower chambers 224, 226 and remove the substrates from the lift pins 208 of the lower chambers 224, 226. The transfer chamber robot 600 moves the substrates from the lower chambers 224, 226 to the process chambers 16 for processing, and afterwards moves the substrates back to the upper chambers 220, 222. When receiving the substrates in the upper chambers 220, 222, the robot 600 places the substrates on a hoop 204 (see FIG. 3) disposed in the upper chambers 220, 222. Once received on the hoop 204, a hoop actuator 202 (see FIG. 3) may lower the substrates to the substrate support 206. When the substrates are ready to be removed from the system, the upper actuator 106 opens the slit valve door 102 to expose both upper chambers 220, 222 to the factory interface. The hoop actuator 202 raises the substrates on the hoops 204. After the substrates are removed, the actuator 106 closes the slit valve door 102 to the upper chambers 220, 222.

Then the pressure in the upper chambers 220, 222 is returned to that of the factory interface by the fluid feeding tubes 108. During this time, the substrates may undergo a post-processing process, such as heat-treating or cooling. For example, in certain cases, such as a spin on glass process, a thin liquid glass coating is heat-cured by heating the substrate support 206. Alternatively, in certain cases where the substrates are hot after returning from the process chambers, the substrates may be cooled prior to transferring the substrates back through the factory interface by cooling the substrate support 206. After the pressure in the upper chamber 220, 222 is increased to the ambient pressure and the optional post-processing step is completed, the robot within the factory interface can move the processed substrates out of the upper chambers.

Transfer Chamber

Figure 5:
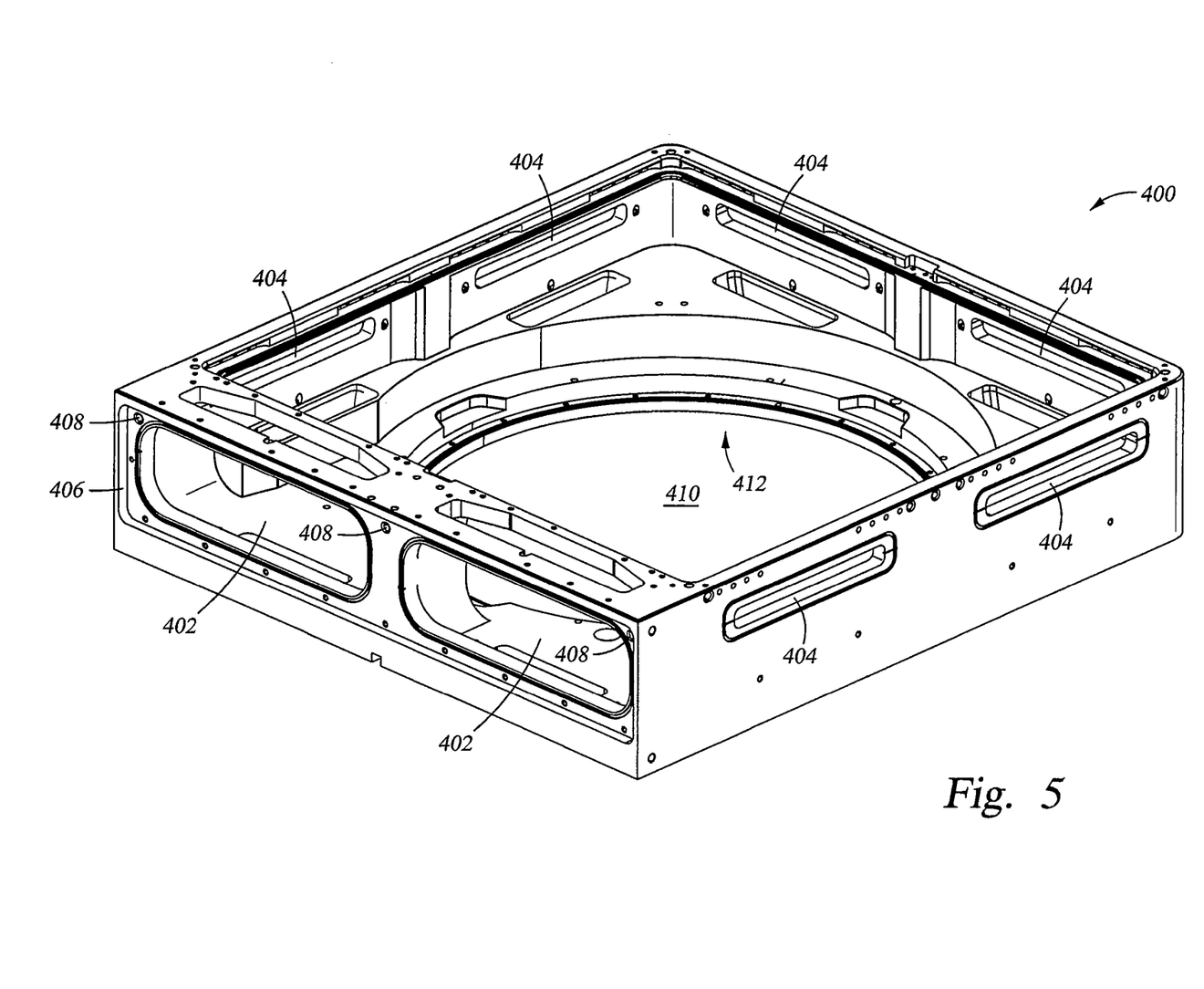
FIG. 5 is a schematic view of the transfer chamber of the present invention.

FIG. 5 is a schematic view of the transfer chamber according to one embodiment of the invention. The transfer chamber 400 has a body that includes a central cavity 412. The body has up to six openings 404 that allow the central cavity 412 to interface with processing chambers. Two openings 402 are present on a first side for interfacing with the load lock chamber 100. The transfer chamber 400 has female connectors 406, 408 that engage with the male connectors 302, 308 of the load lock chamber 100. Male connectors 302 mates with female connectors 406 and male connectors 308 connect with female connectors 408. An opening 410 is provided in the lower portion of the body for the transfer chamber robot 600.

Figure 6:
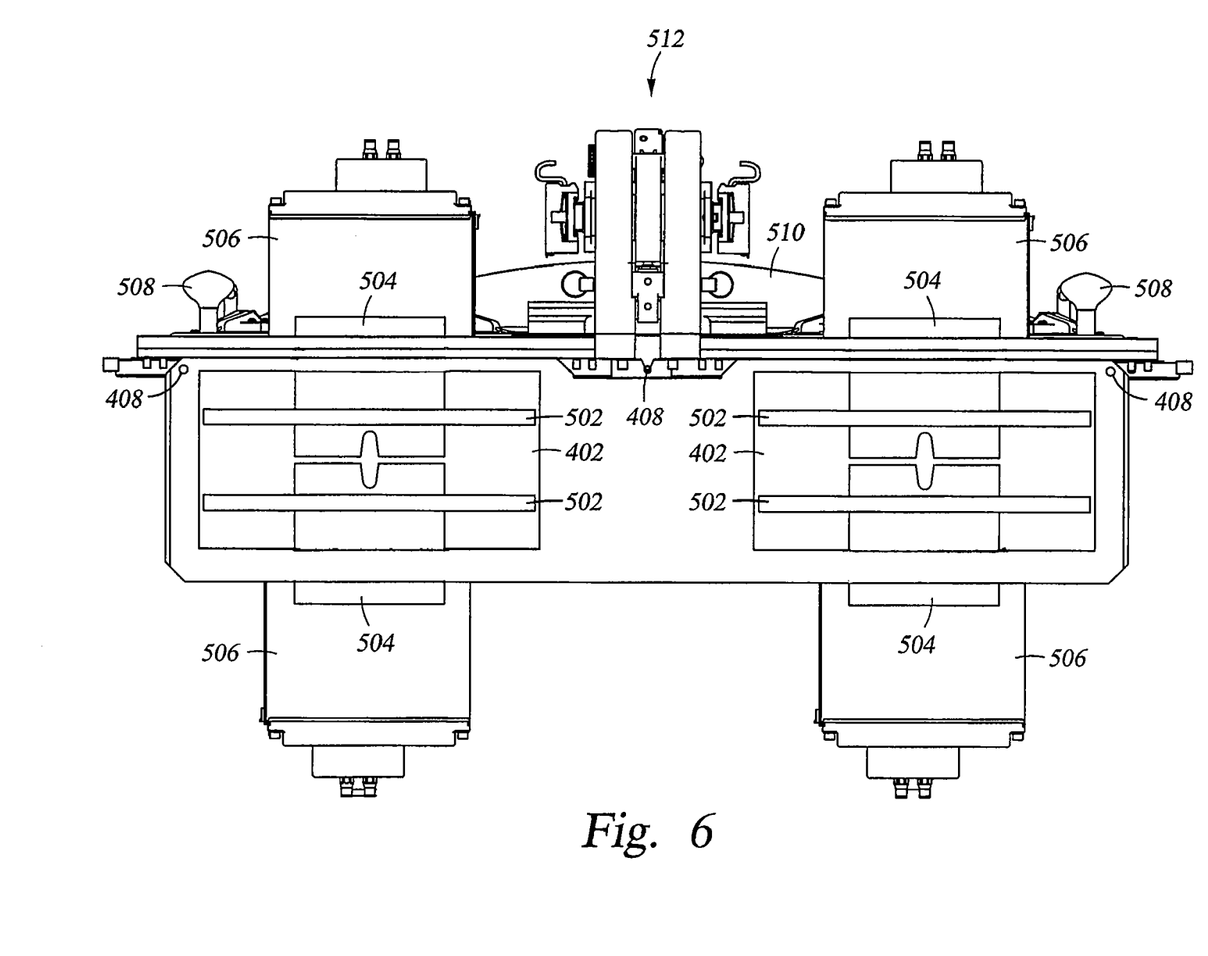
FIG. 6 is a schematic view of the transfer chamber where the load lock chamber interfaces.

FIG. 6 is a schematic view of the transfer chamber where the load lock chamber interfaces according to one embodiment of the invention. Slit valve doors 502 for sealing the transfer chamber side of the load lock chamber 100 are provided on the transfer chamber 400. A slit valve door 502 is provided for each chamber 220, 222, 224, 226 of the load lock chamber 100. There are two upper doors 502 and two lower doors 502. The two upper doors 502 correspond to the two upper chambers 220, 222 of the load lock chamber 100 and the two lower doors 502 correspond to the two lower chambers 224, 226 of the load lock chamber 100. Each of the slit valve doors 502 is connected to a slit valve actuator 506 by an actuator connection 504. In one embodiment, the slit valve actuators 506 are pneumatic and have tubing to provide pneumatic fluid to the actuators. Bellows (not shown), may surround pneumatic tubing and prevent any pneumatic fluid from leaking into the system.

The transfer chamber 400 has a lid 510 (see FIG. 6) that pivots open by a robot arm 512 (see FIG. 6) so that the transfer chamber 400 can be serviced as needed. The lid 510 can be or may have a transmissive region (such as a quartz window) for metrology purposes. Across the upper surface of the transfer chamber 400, through beam local center finders 508 are attached that can detect the substrate in different planes within the system. Because the substrates are brought into the transfer chamber 400 through the lower chambers 224, 226 of the load lock chamber 100 and removed from the transfer chamber 400 through the upper chambers 220, 222 of the load lock chamber 100, the substrates will be moving within the transfer chamber 400 in multiple planes. The through beam local center finders 508 can be used to track the substrates in multiple planes within the transfer chamber 400.

Transfer Chamber Robot

Figure 7:
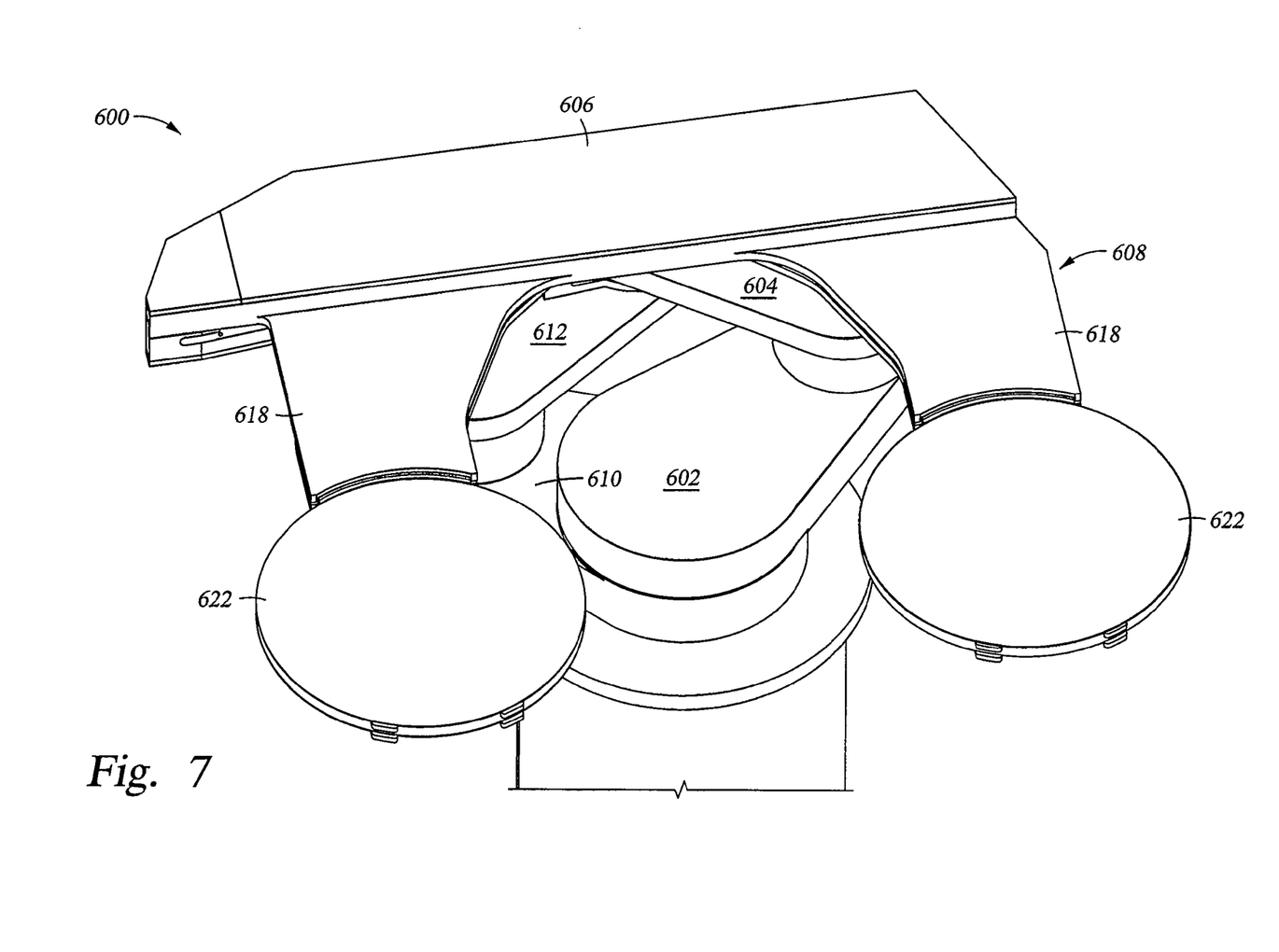
FIG. 7 is a schematic view of the transfer robot of the present invention.
Figure 8:
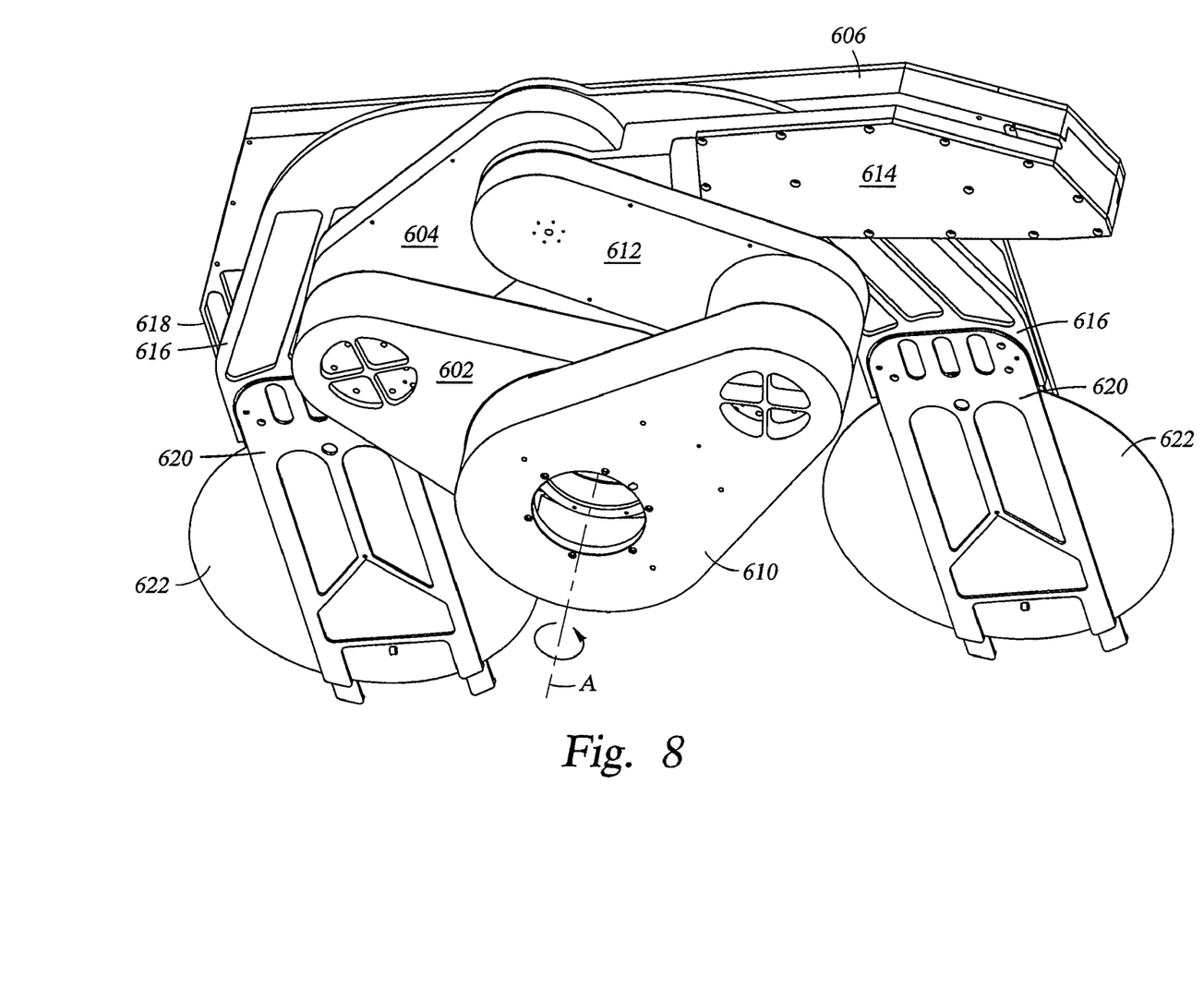
FIG. 8 is a bottom view of the transfer robot of the present invention.
Figure 9:
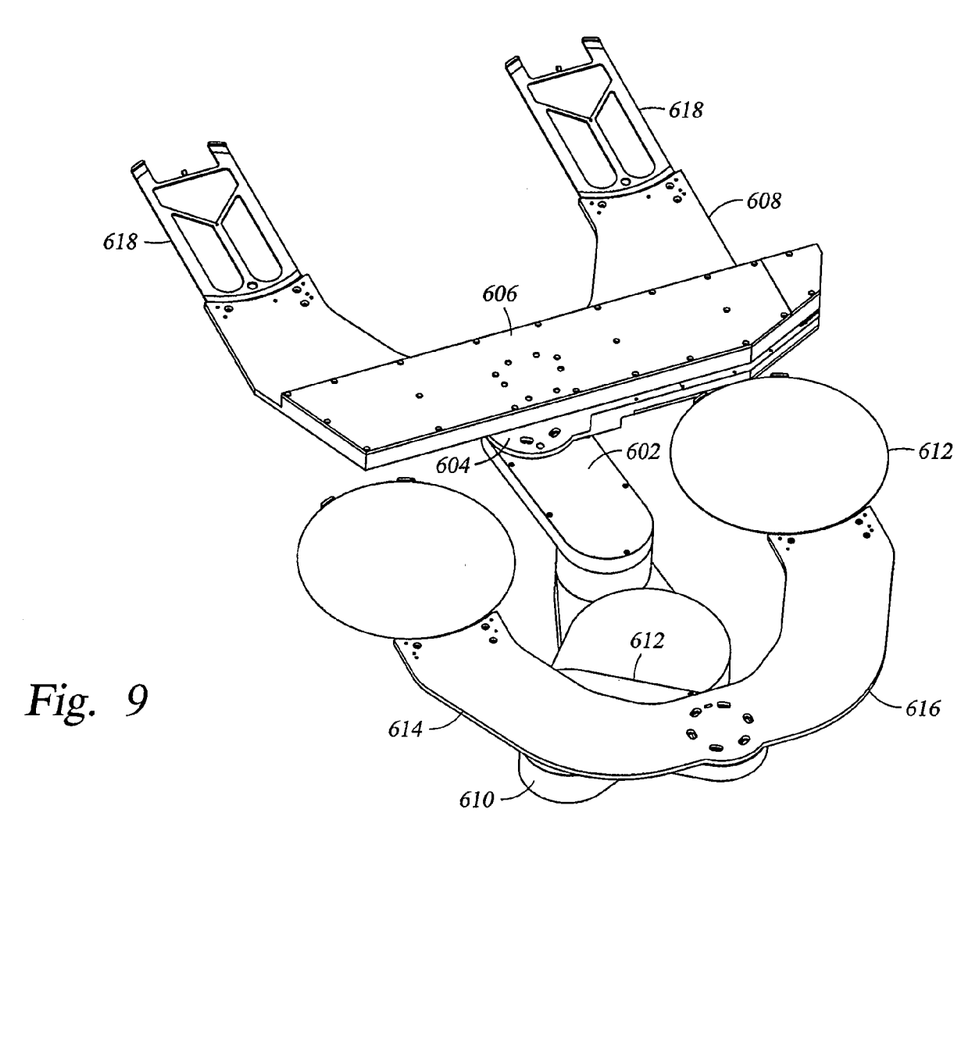
FIG. 9 is a schematic view of the transfer robot of the present invention.

FIGS. 7-9 show one embodiment of the transfer chamber robot 600 of the present invention. The transfer chamber robot 600 has multiple arms 608, 616. The transfer chamber robot 600 is configured to access both the lower chambers 224, 226 and the upper chambers 220, 222 of the load lock chamber 100. The robot 600 is capable of moving the arms 608, 616 within multiple planes. The robot 600 can rotate and extend the arms 608, 616 within the X-Y plane. The robot 600 can also translate up and down in the Z plane so that substrates retrieved from the lower chambers 224, 226 can be lifted up and placed into the processing chambers. Additionally, it is contemplated that the robot 600 can move in the Z plane so that substrates can be placed into processing chambers having different elevations. For example, the robot 600 may access processing chambers stacked one on top of the other.

In one embodiment, double decker chambers are employed. Double decker chambers are two chambers vertically stacked one on top of the other which share the same footprint within the system. The chambers each have a chamber volume that may be environmentally isolated from the other chamber within the double decker arrangement. The chambers may share the same pump and gas panel so that costs may remain low or the chambers may have independent pumps and independent gas panels. Additionally, the chambers may be tailored to perform different functions. The chambers may be mirror images of each other so that one chamber of the double decker arrangement is inverted relative to the other chamber of the double decker arrangement. When all processing chambers within a processing system are changed to double decker chambers, substrate throughput may be doubled.

The robot 600 includes a lower pivot arm 602, 610 for each arm assembly 608, 616 and an upper pivot arm 604, 612 for each arm assembly 608, 616. The arm assemblies 608, 616 each have two flat blades 618, 620. Therefore, each arm assembly 608, 616 is capable of holding two substrates. One substrate can be held in each blade 618, 620. In one embodiment, the blades 618, 620 may have a pocket. In the embodiment depicted in FIG. 8, the blades 618, 620 are flat and do not form a pocket. The blades 618, 620 are flat against the backside of the substrate 622. The substrate 622 rests on the blades 618, 620 so that the blades 618, 620 do not scrape the edge of the substrate 622. The blades 618, 620 that do not form a pocket do not contact the substrate edge.

As seen in FIG. 9, the robot 600 can extend out so that each of the arms 602, 610 can extend the blades 618, 620 into different process chambers at different locations along the transfer chamber 400. The arms 602, 610 are capable of accessing processing chambers or the load lock chamber 100 with each arm 602, 610 accessing a chamber on an opposite side of the transfer chamber 400 or on an adjacent side of the transfer chamber 400. The lower pivot arms 602, 610 and the upper pivot arms 604, 612 can each extend so that the upper arm assembly 616 and the lower arm assembly 608 extend independently from one another. To extend the arm assemblies 608, 616, the upper pivot arms 604, 612 and the lower pivot arms 602, 610 rotate. The robot 600 can collectively move in the Z-direction whereby the entire transfer chamber robot 600 is translated in the z-direction.

By providing a load lock chamber 100 that has four environmentally isolated chambers, substrate throughput can be greatly increased because as many as four substrates can be simultaneously transferred through the load lock chamber 100. Additionally, having a double arm robot that is capable of movement in multiple planes increases substrate throughput because as many as four substrates can be transported by the robot at any one time.

While the foregoing is directed to embodiments of the present invention, other and further embodiments of the invention may be devised without departing from the basic scope thereof, and the scope thereof is determined by the claims that follow.

The invention claimed is:
1. A method of processing a substrate, comprising:
positioning two substrates within a load lock chamber body, wherein the substrates are positioned within first and second chambers that are within the load lock chamber body, wherein the first and second chambers lie in a laterally spaced relation, and wherein the load lock chamber body is coupled with an integrated processing tool;

removing the substrates from the load lock chamber body and positioning the substrates in the integrated processing tool;

processing the substrates;

re-positioning the substrates within the load lock chamber body, wherein the substrates are positioned within third and fourth chambers that are within the load lock chamber body, wherein the third and fourth chambers lie in a laterally spaced relation and at an elevation above the first and second chambers, and wherein the first, second, third, and fourth chambers are environmentally isolated from each other during processing; and monitoring conditions of the substrates within the first, second, third, and fourth chambers, wherein the monitoring comprises monitoring the conditions through transmissive chamber lids.

2. A method of servicing a load lock chamber, comprising:

unlocking a lid locking mechanism that couples a lower chamber lid to a load lock chamber body;

pivoting the lower chamber lid away from the body;

removing an upper chamber lid coupled to an upper chamber of the load lock body; and servicing the load lock chamber, wherein a substrate support device is coupled to and movable with the lower chamber lid.

3. The method of claim 2, wherein the substrate support device is a lift pin actuator.

4. The method of claim 2, wherein the substrate support device is a substrate support pedestal.

* * * * *